United States Patent [19]
Goodson et al.

[11] Patent Number: 5,625,646
[45] Date of Patent: Apr. 29, 1997

[54] METHOD, DEVICE, DSP AND MODEM FOR EFFICIENT ECHO CANCELER PHASE ROLL TRACKING

[75] Inventors: Richard L. Goodson, Huntsville; Mickey C. Rushing, Harvest, both of Ala.

[73] Assignee: Motorola, Inc., Schaumburg, Ill.

[21] Appl. No.: 494,914

[22] Filed: Jun. 26, 1995

[51] Int. Cl.$^6$ ................................................ H04B 15/00
[52] U.S. Cl. .......................... 375/285; 375/346; 370/286; 379/406; 379/410
[58] Field of Search ............................ 375/285, 346; 379/406, 410; 370/32.1

[56] References Cited

U.S. PATENT DOCUMENTS

| | | |
|---|---|---|
| 4,736,414 | 4/1988 | Montagna et al. ............... 370/32.1 |
| 5,132,963 | 7/1992 | Ungerboeck ...................... 370/32.1 |
| 5,247,512 | 9/1993 | Sugaya et al. .................... 370/32.1 |
| 5,483,594 | 1/1996 | Prado et al. ...................... 370/32.1 |
| 5,528,687 | 6/1996 | Tanaka et al. .................... 370/32.1 |

*Primary Examiner*—Stephen Chin
*Assistant Examiner*—Don Vo
*Attorney, Agent, or Firm*—Darleen J. Stockley

[57] ABSTRACT

The present invention provides a novel method, device, digital signal processor and modem for efficiently determining and tracking a phase roll of a far end echo by utilizing a novel phase error generator and a novel, efficient replica generator. The efficient replica generator utilizes a uniquely positioned phase rotator to facilitate replication of the far end echo. A unique combination of a Hilbert phase splitter and a conjugate Hilbert phase splitter together with a rectangular to polar converter enable the novel phase error generator to provide a reliable phase error.

33 Claims, 4 Drawing Sheets

METHOD, DEVICE, DSP AND MODEM FOR EFFICIENT ECHO CANCELER PHASE ROLL TRACKING

FIELD OF THE INVENTION

This application relates to data communications devices including, but not limited to, modems, etc.

BACKGROUND OF THE INVENTION

Presently, data communication equipment ("DCE"), such as modems, for example, are used to transport digital data between data terminal equipment such as personal computers, workstations, and the like, over channels such as telephone lines. Typically, the communication signal includes digital data in the form of a carrier signal that is modulated by a predetermined transmit constellation of signal points at a signaling rate. Hereafter the signaling rate will also be known as the symbol rate. A set of signal points taken from the transmit constellation represents a digital code or value to be transported. At the local DCE, a carrier signal is thus modulated with the set of constellation signal points corresponding to the digital code or value to be transported over the channel. Impedance mismatch between the remote DCE and the channel can cause reflections, or echoes, back into the receiver of the local DCE. Echoes into the local receiver caused by impedance mismatch at the remote end are known as far end echoes. In addition, the channel may introduce frequency offset which will alter the carrier frequency of signals which pass through it. This frequency offset is known as far end echo phase roll. The local DCE will attempt to generate an exact replica of this far end echo and subtract, or cancel, it from the local receiver. If the effect of the phase roll is not considered, then an exact replica cannot be constructed, and the result will be a reduction in the maximum data rate supported by the local DCE receiver. Therefore, before the digital data is transported, the far end echo phase roll must be determined and tracked.

As a result, there is a need to provide a DCE with the mechanism for determining and tracking the phase roll of the far end echo.

DESCRIPTION OF THE PREFERRED EMBODIMENT

The present invention provides a novel method, device, digital signal processor and modem for efficiently determining and tracking a phase roll of a far end echo by utilizing a novel phase error generator and a novel, efficient replica generator. A unique combination of a Hilbert phase splitter and a conjugate Hilbert phase splitter together with a rectangular to polar converter enable the novel phase error generator to provide a reliable phase error. The efficient replica generator utilizes a uniquely positioned phase rotator to facilitate replication of the far end echo.

The following is a list of symbols used in this document and their meanings $x(n)$ The transmit symbols, a complex sequence taken from the set of points in the constellation.

T The transmit symbol interval.

$f_c$ The transmit carrier frequency.

n The symbol interval time index.

$f_o$ The frequency offset induced by the echo channel.

$\theta$ The transmitter startup phase.

$\phi$ The echo channel startup phase.

D The echo delay in symbol intervals.

$\{h_m(n)\}$ The echo distortion impulse response.

$\{\hat{h}_m(n)\}$ The echo distortion estimated impulse response

Figure 1:
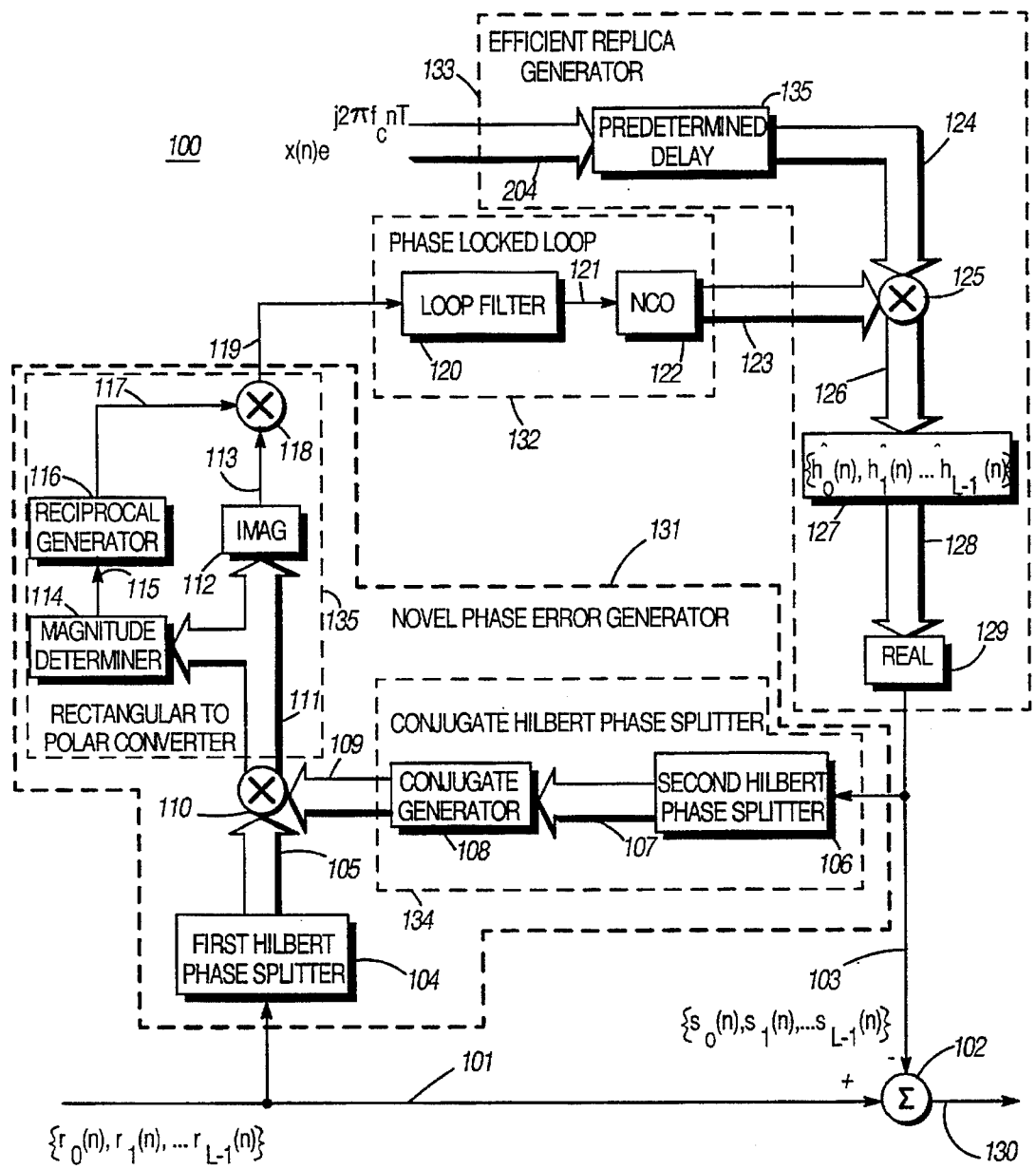
FIG. 1 is a block diagram illustrating the first embodiment of a device with efficient far end echo canceler phase roll tracking, in accordance with the present invention.

L The number of received echo samples per symbol interval $\{r_0(n),r_1(n), \ldots ,r_{L-1}(n)\}$ The received echo samples $\{s_0(n),s_1(n), \ldots ,s_{L-1}(n)\}$ The generated echo replica samples Referring now to FIG. 1, there is shown a block diagram of a first embodiment of a device 100 with efficient far end phase roll tracking, in accordance with the present invention. A description of operation of the device follows.

Figure 2:
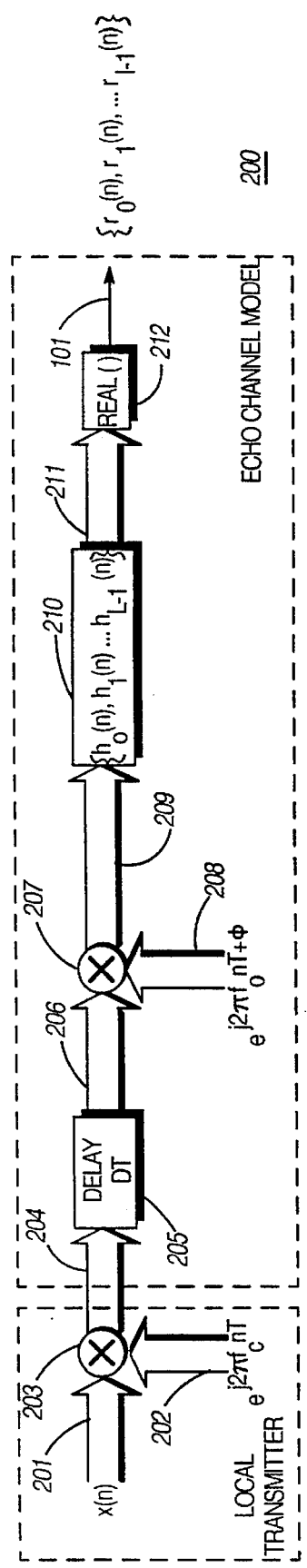
FIG. 2 is a block diagram illustrating a local transmitter and echo channel model for generating a far end echo signal.

The analytical model of the local transmitter 213 and the echo channel model 214 is given in FIG. 2, numeral 200. The local transmit symbols are represented by x(n) 201, a complex sequence taken from the set of points in the constellation. These symbols modulate 203 a carrier signal $e^{j2\pi f_c nT}$ 202 producing the local transmitter output 204, where $f_c$ is the carrier frequency, n is the symbol time index, and T is the symbol interval.

The echo channel 214 is modeled as a D symbol interval delay 205, having an output 206 that is modulated 207 with a phase offset carrier signal $e^{j2\pi f_o nT+\phi}$ 208 having a frequency offset $f_o$ and a phase offset $\phi$, to provide an output signal 209 to a distortion filter 210 having a real operator 212. The distortion filter 210 is modeled as an interpolating filter, meaning that the filter output sample rate is L times the filter input sample rate, where L is a positive integer. The distortion filter 210 consists of L independent transversal filters. The $m^{th}$ filter ($0 \leq m < L$, m a positive integer) has coefficients $h_m(n)$, with an input sample interval and an output sample interval equal to the symbol interval T. The $m^{th}$ filter outputs at time $nT+mT/L$. The real operator 212 eliminates the imaginary component from the distortion filter output 211 to provide an echo channel output 101. Each echo channel output 101 $\{r_0(n),r_1(n), \ldots ,r_{L-1}(n)\}$ corresponds to the filter coefficient $\{h_0(n),h_1(n), \ldots ,h_{L-1}(n)\}$.

Referring again to the far end echo canceler 100 that efficiently determines and tracks phase roll of a far end echo in a communication system, in FIG. 1, the received echo signal 101 $\{r_0(n),r_1(n), \ldots ,r_{L-1}(n)\}$ is applied to a novel phase error generator 131 that utilizes at least one Hilbert phase splitter to generate a phase error 119. A phase locked loop 132 is coupled to the novel phase error generator 131 and utilizes the phase error 119 to generate an estimated phase of the far end echo 123. An efficient replica generator 133 having a uniquely positioned phase rotator 125 is coupled to the phase locked loop 132 and utilizes the estimated phase of the far end echo 123 to generate a replica of the far end echo 103. A combiner 102 is coupled to receive the far end echo 101 and to the efficient replica generator 133 and is used for subtracting a real component of the replica of the far end echo 103 from the far end echo 101 to provide a residual far end echo 130.

Typically, the novel phase error generator 131 includes a first Hilbert phase splitter 104, a conjugate Hilbert phase splitter 134, a multiplier 110, and a rectangular to polar converter 135. The first Hilbert phase splitter 104 is coupled to receive the far end echo signal 101, and is used for generating a complex analytic representation 105 of the far end echo signal. The conjugate Hilbert phase splitter 134 is coupled to the efficient replica generator 133 and is used for generating a conjugated complex analytic representation of the replica of the far end echo. The multiplier 110 is coupled to the first Hilbert phase splitter 104 and the conjugate Hilbert phase splitter 134 and is used for providing an output by multiplying the complex analytic representation of the far end echo times the conjugated complex analytic representation of the replica of the far end echo. The rectangular to polar converter 131 is coupled to the multiplier 110 and is used for generating a normalized phase error.

The conjugate Hilbert phase splitter 134 typically includes a second Hilbert phase splitter 106 and a conjugate generator 108. The second Hilbert phase splitter 106 is operably coupled to the efficient replica generator 133 and is used for generating a complex analytic representation of the replica of the far end echo. The conjugate generator 108 is coupled to the second Hilbert phase splitter 106 and is used for generating the conjugated complex analytic representation 109 of the replica of the far end echo.

The rectangular to polar converter 131 typically includes a magnitude determiner 114, a reciprocal generator 116, an imaginary operator 112, and a normalizer 118. The magnitude determiner 114 is coupled to the multiplier 110 and is used for determining a magnitude 115 of the output of the multiplier 110. The reciprocal generator 116 is coupled to the magnitude determiner 114 and is used for generating a reciprocal 117 of the magnitude of the output of the multiplier 110. The imaginary operator 112 is coupled to receive the output of the multiplier 110 and is used for generating an imaginary component 113 of the output of the multiplier 110. The normalizer 118 is coupled to the reciprocal generator 116 and the imaginary operator 112 and is used for multiplying the imaginary component times the reciprocal of the magnitude of the output of the multiplier 110 to provide a normalized phase error.

The phase locked loop 132 typically includes a loop filter 120 and a numerically controlled oscillator (NCO) 122. The loop filter 120 is coupled to the novel phase error generator 131 and is used for generating a control signal. The numerically controlled oscillator 122 is coupled to the loop filter 120 and is used for generating the estimated phase of the far end echo. In a preferred embodiment, the phase locked loop is a second order phase locked loop.

The efficient replica generator having a uniquely positioned phase rotator typically includes: a delay unit 135, a phase rotator 125, and a impulse response generator 127. The delay unit 135 is coupled to receive a transmit signal and a predetermined delay, for providing a delayed transmit signal 124. The phase rotator 125 is coupled to the delay unit 135 and to the phase lock loop 132 and is used for rotating the delayed transmit signal to provide a signal 126 having a phase matching the phase of the far end echo. The impulse response generator 127 is coupled to the phase rotator 125 and uses a real operator 129 to provide a real component 103 of the replica 128 of the far end echo.

The received echo signal 101 $\{r_0(n), r_1(n), \ldots, r_{L-1}(n)\}$ is applied to the combiner 102. The far end echo canceler 100 generates a replica of the received echo signal 103 $\{s_0(n), s_1(n), \ldots, s_{L-1}(n)\}$. The far end echo canceler adapts the echo distortion filter estimate 127 and the far end phase roll estimate 123 to minimize the mean squared difference between the received echo signal and the far end echo canceler replica. The adaptation of the echo distortion filter estimate will not be discussed since it is known to those skilled in the art. For the sake of simplicity, the echo distortion filter estimate coefficients $\{\hat{h}_m(n)\}$ are selected to be approximately equal to the echo channel filter coefficients $\{h_m(n)\}$. At the time the loop is started, the loop filter 120 is typically initialized such that a zero input will produce a zero output, and the output of the NCO 122 is $e^{j0}$.

The received echo $r_m(n)$ is equal to $$r_m(n) = Re\{[x(n-D)e^{j[2\pi(f_c+f_o)nT+\theta+\phi]}] * h_m(n)\}$$

where '*' indicates convolution and $\theta$ is phase angle due to the carrier delayed by DT, and $\phi$ is a random startup phase angle.

Similarly, the echo replica $s_m(n)$ is equal to $$s_m(n) = Re\{[x(n-D)e^{j[2\pi f_c nT+\theta]}] * \hat{h}_m(n)\}$$

which is the same as $r_m(n)$ except for the frequency offset $f_o$ and the random startup phase angle $\phi$.

The received echo $\{r_m(n)\}$ and the echo replica $\{s_m(n)\}$ are applied to Hilbert phase splitters 104 and 106, respectively, and sampled once per symbol interval, generating complex analytic signals 105 and 107, respectively. A complex analytic signal is identical to it's real signal counterpart except that all negative frequency amplitudes are zero.

The signal 105 is then given by $$[x(n-D)e^{j[2\pi(f_c+f_o)nT+\theta+\phi]}] * h_o(n)$$

and the signal 107 is given by $$[x(n-D)e^{j[2\pi f_c nT+\theta]}] * \hat{h}_o(n)$$

Let the time span of the echo channel impulse response be $T_e$. If $2\pi f_o T_e$ is small, then the phase roll can be factored out of the equations. Signal 105 then becomes $$\{[x(n-D)e^{j2\pi f_c nT}] * h_o(n)\} e^{j[2\pi f_o nT+\theta+\phi]}$$

and signal 107 becomes $$\{[x(n-D)e^{j2\pi f_c nT}] * \hat{h}_o(n)\} e^{j\theta}$$

Conjugating 107 and multiplying by 105 yields 111

$$\{[x(n-D)e^{j2\pi f_c nT}] * h_o(n)\} \{[x(n-D)e^{j2\pi f_c nT}] * \hat{h}_o(n)\}^* e^{j[2\pi f_o nT+\theta+\phi]} e^{-j\theta}$$

which, assuming $\{\hat{h}_m(n)\} \approx \{h_m(n)\}$, 111 becomes $$|\{x(n-D)e^{j2\pi f_c nT}\} * h_o(n)|^2 e^{j[2\pi f_o nT+\phi]}$$

Dividing the imaginary portion of 111 by the magnitude of 111 yields 119

$$\sin(2\pi f_o nT+\phi)$$

This is the standard sinusoidal phase error term commonly used in phase locked loops.

Typically, the phase error is applied to a second order loop filter 120, which generates a control signal 121 to a digital (numerically controlled) oscillator (NCO) 122, which generates the phase roll estimate and rotates 125 the delayed transmit symbols 124, and the loop is closed.

Figure 3:
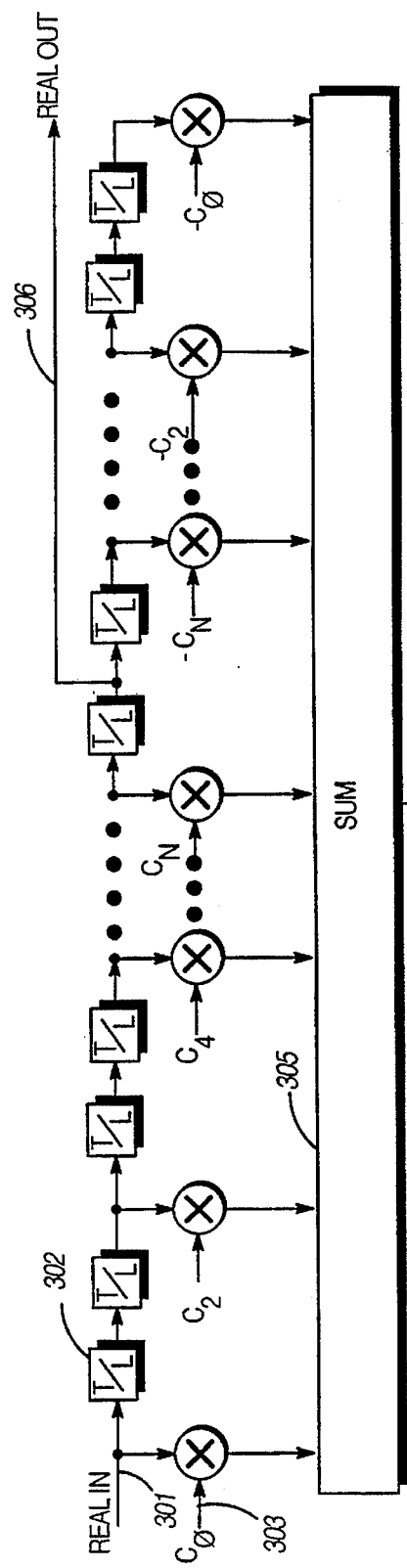
FIG. 3 is a block diagram illustrating the Hilbert phase splitters.

Referring now to FIG. 3, numeral 300, the Hilbert phase splitters 106 and 104 are detailed. There are a real input 301 and a complex input $C_{100}$ 303, and there are a real output 306 and an imaginary output 307. Delays for the real input are set to T/L 302, where T is the is the symbol interval and L is a predetermined integer, are multiplied by corresponding complex inputs and the products obtained are summed 305 to provide the imaginary output 307. The filter coefficients are predetermined approximations to a Hilbert filter impulse response. The filter is designed in such a way that every other coefficient is zero, and that the coefficients are antisymmetric about midpoint. This is done by making the frequency response of the filter with sample rate fs symmetric about fs/4, e.g. $|H(e^{j\pi f})|=|H(e^{j2\pi(fs/2-f)})|$, $0<f<fs/2$.

Figure 4:
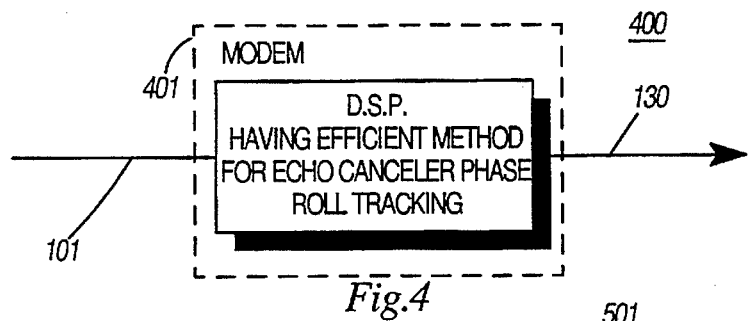
FIG. 4 is a block diagram showing an embodiment of the present invention wherein a modem includes a digital signal processor having efficient far end echo canceler phase roll tracking in accordance with the present invention.

Referring now to FIG. 4, numeral 400, there is shown another embodiment of the invention wherein a modem includes a digital signal processor having an efficient method for echo canceler phase roll tracking 400 in accordance with the present invention. Similar to the first embodiment described above, the input signal 104 may contain frequency and phase offset. The modem 401 includes a digital signal processor ("DSP") 402 such as, for instance, the DSP56002, available from Motorola, Inc. The DSP is programmed to process the received echo 101 and generate the output 130 with echo removed.

Figure 5:
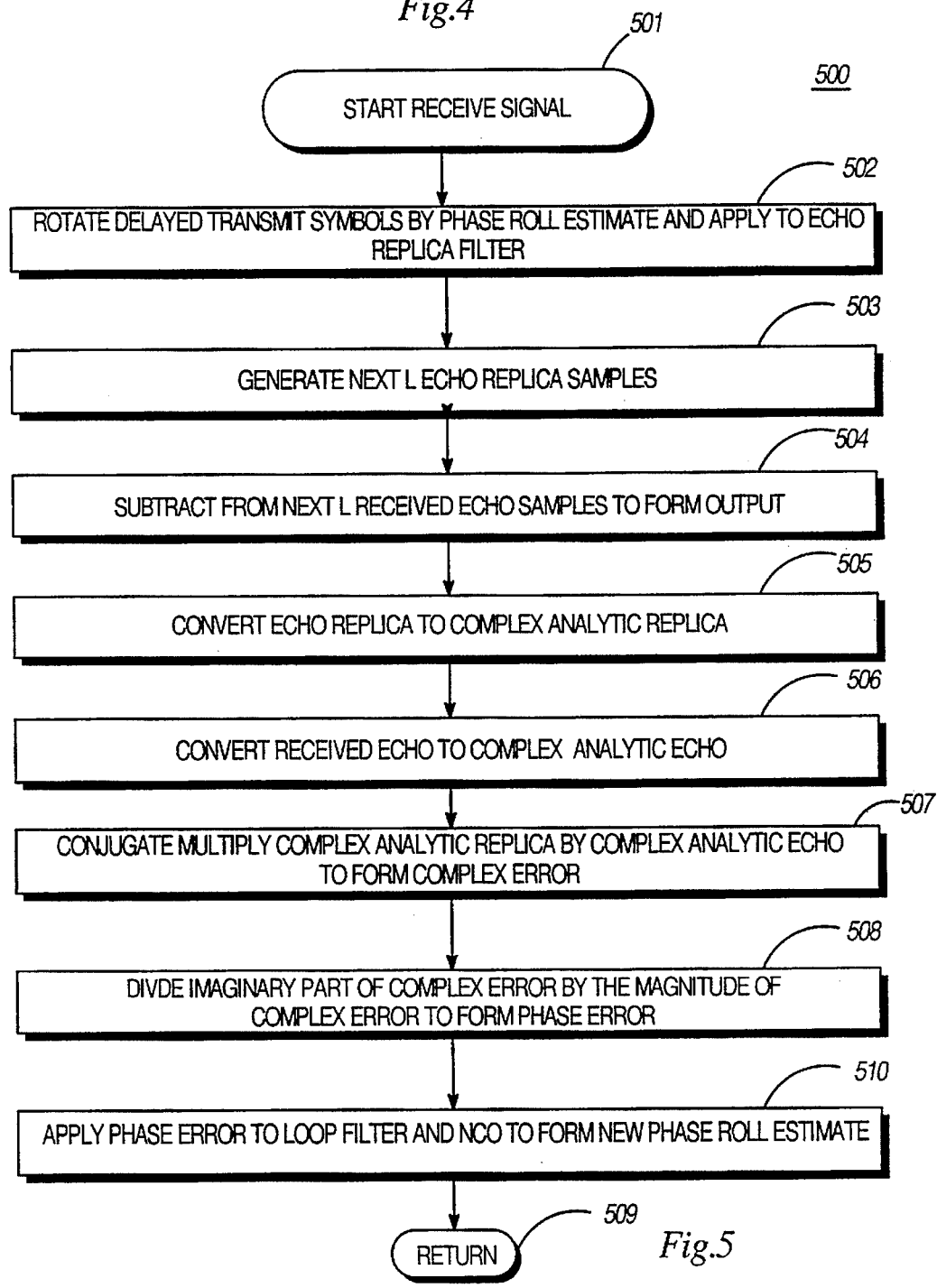
FIG. 5 is a flow diagram of one embodiment of steps for implementing a method of efficient far end echo canceler phase roll tracking in accordance with the present invention.

Referring now to FIG. 5, numeral 500, the process starts by receiving the echo signal 101, step 501. Then the delayed transmit symbols are rotated by the phase roll estimate and applied to the echo replica filter 502. The resulting signal is analogous to signal 126.

The next L echo replica samples are then generated, step 503. The resulting signal is analogous to 103.

The L echo replica samples are subtracted from the L received echo samples to form the output, step 504. The resulting output is analogous to 130.

The echo replica and received echo are converted to complex analytic signals, steps 505 and 506, respectively. The resulting signals are analogous to 107 and 105, respectively.

The complex analytic echo replica is conjugated and multiplied by the received echo to form the complex error, step 507. The resulting signal is analogous to 111.

The imaginary part of the complex error is divided by the magnitude of the complex error to form the phase error, step 508. The resulting signal is analogous to 119.

The phase error is applied to the second order loop filter and NCO to form a new phase roll estimate, step 509. The resulting signal is analogous to 123.

Figure 6:
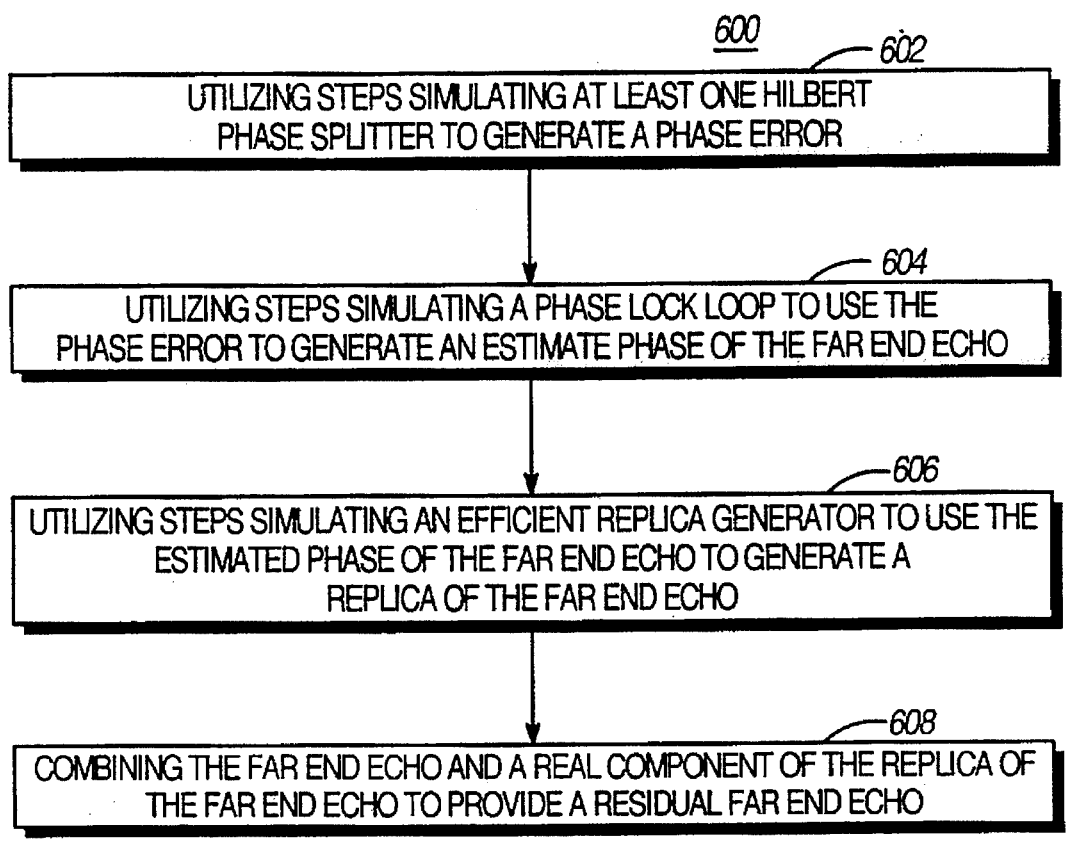
FIG. 6 is a flow diagram of another embodiment of steps for implementing a method of efficient far end echo canceler phase roll tracking in accordance with the present invention.

FIG. 6, numeral 600, is a flow diagram of another embodiment of steps for implementing a method of efficient far end echo canceler phase roll tracking in accordance with the present invention. The method, typically implemented by a computer program embodied in a tangible medium, includes: (A) utilizing steps simulating at least one Hilbert phase splitter to generate a phase error 602; B) utilizing steps simulating a phase lock loop to use the phase error to generate an estimated phase of the far end echo 604: C) utilizing steps simulating an efficient replica generator to use the estimated phase of the far end echo to generate a replica of the far end echo 606; and D) combining the far end echo and a real component of the replica of the far end echo to provide a residual far end echo 608. The tangible medium is typically a memory unit of a digital signal processor.

Utilizing steps simulating at least one Hilbert phase splitter to generate a phase error 602 typically includes: A) generating, by steps simulating a first Hilbert phase splitter, a complex analytic representation of the far end echo; B) generating, by steps simulating a conjugate Hilbert phase splitter, a conjugated complex analytic representation of the replica of the far end echo; C) multiplying the complex analytic representation of the far end echo times the conjugated complex analytic representation of the replica of the far end echo to provide a multiplied output; and D) generating, by steps simulating a rectangular to polar converter, a normalized phase error.

The steps simulating the conjugate Hilbert phase splitter typically include: A) generating, by steps simulating a second Hilbert phase splitter, a complex analytic representation of the replica of the far end echo; and B) generating, by steps simulating a conjugate generator, the conjugated complex analytic representation of the replica of the far end echo.

The steps simulating the rectangular to polar converter generally include: A) determining a magnitude of the multiplied output; B) generating a reciprocal of the magnitude of the multiplied output; C) generating an imaginary component of the multiplier output; and D) multiplying the imaginary component times the reciprocal of the magnitude of the multiplied output to provide a normalized phase error.

Utilizing steps simulating a phase lock loop 604 to use the phase error to generate an estimated phase of the far end echo typically includes: A) generating, by steps simulating a loop filter, a control signal; and B) generating, by steps simulating a numerically controlled oscillator, the estimated phase of the far end echo. In the preferred embodiment, the phase locked loop is a second order phase locked loop.

Generally, utilizing steps simulating an efficient replica generator 606 to use the estimated phase of the far end echo to generate a replica of the far end echo includes: A) providing a delayed transmit signal; B) rotating the delayed transmit signal to match the phase of the far end echo; and C) utilizing steps simulating an impulse response generator to provide a real component of a replica of the far end echo.

Thus, a modem with improved far end echo canceler phase roll tracking, in accordance with the present invention, includes Hilbert phase splitters, a normalizer, a second order loop filter, a NCO, a phase roll rotator, and a echo distortion filter estimate. In this way, the adverse effects of echo carrier offset are minimized, and the modem is able to properly cancel the effects of the far end echo.

One key advantage of a modem with improved far end echo canceler phase roll tracking, in accordance with the present invention, is that far less computations are required to generate the phase error than would be needed if both the real and imaginary echo distortion filter estimate had to be generated.

Another advantage of the present invention is that it uses computationally efficient Hilbert filters, reducing the complexity of the solution compared to other less efficient implementations.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims. The invention is further defined by the following claims.

Tracking includes continuously adjusting the phase and frequency estimates of the phase roll.

We claim:

1. A device for efficiently determining and tracking phase roll of a far end echo in a communication system comprising:
   A) a novel phase error generator, coupled to receive the far end echo, for utilizing at least one Hilbert phase splitter to generate a phase error;
   B) a phase locked loop, coupled to the novel phase error generator, for utilizing the phase error to generate an estimated phase of the far end echo;
   C) an efficient replica generator having a uniquely positioned phase rotator, coupled to the phase locked loop, for utilizing the estimated phase of the far end echo to generate a replica of the far end echo; and
   D) a combiner, coupled to receive the far end echo and to the efficient replica generator, for combining the far end echo and a real component of the replica of the far end echo to provide a residual far end echo.

2. The device of claim 1 wherein the novel phase error generator includes:
   A) a first Hilbert phase splitter, coupled to receive the far end echo, for generating a complex analytic representation of the far end echo;
   B) a conjugate Hilbert phase splitter, coupled to the efficient replica generator, for generating a conjugated complex analytic representation of the replica of the far end echo;
   C) a multiplier, coupled to the first Hilbert phase splitter and the conjugate Hilbert phase splitter, for providing an output by multiplying the complex analytic representation of the far end echo and the conjugated complex analytic representation of the replica of the far end echo; and
   D) a rectangular to polar converter, coupled to the multiplier, for generating a normalized phase error.

3. The device of claim 2 wherein the conjugate Hilbert phase splitter includes:
   A) a second Hilbert phase splitter, operably coupled to the efficient replica generator, for generating a complex analytic representation of the replica of the far end echo; and
   B) a conjugate generator, coupled to the second Hilbert phase splitter, for generating the conjugated complex analytic representation of the replica of the far end echo.

4. The device of claim 2 wherein the rectangular to polar converter includes:
   A) a magnitude determiner, coupled to the multiplier, for determining a magnitude of the output of the multiplier;
   B) a reciprocal generator, coupled to the magnitude determiner, for generating a reciprocal of the magnitude of the output of the multiplier;
   C) an imaginary operator, coupled to receive the output of the multiplier, for generating an imaginary component of the output of the multiplier; and
   D) a normalizer, coupled to the reciprocal generator and the imaginary operator, for multiplying the imaginary component and the reciprocal of the magnitude of the output of the multiplier to provide a normalized phase error.

5. The device of claim 1 wherein the phase locked loop includes:
   A) a loop filter, coupled to the novel phase error generator, for generating a control signal;
   B) a numerically controlled oscillator, coupled to the loop filter, for generating the estimated phase of the far end echo.

6. The device of claim 1 wherein the phase locked loop is a second order phase locked loop.

7. The device of claim 1 wherein the efficient replica generator having a uniquely positioned phase rotator includes:
   A) a delay unit, coupled to receive a transmit signal and a predetermined delay, for providing a delayed transmit signal;
   B) the phase rotator, coupled to the delay unit and to the phase locked loop, for rotating the delayed transmit signal to match the phase of the far end echo; and
   C) the impulse response generator, coupled to the phase rotator, using a real operator to provide a real component of a replica of the far end echo.

8. A method for efficiently determining and tracking phase roll of a far end echo in a communication system comprising the steps of:
   A) utilizing, by a novel phase error generator, at least one Hilbert phase splitter to generate a phase error;
   B) utilizing, by a phase locked loop, the phase error to generate an estimated phase of the far end echo;
   C) utilizing, by an efficient replica generator having a uniquely positioned phase rotator, the estimated phase of the far end echo to generate a replica of the far end echo; and
   D) combining, by a combiner, the far end echo and a real component of the replica of the far end echo to provide a residual far end echo.

9. The method of claim 8 wherein utilizing, by a novel phase error generator, at least one Hilbert phase splitter to generate a phase error includes:
   A) generating, by a first Hilbert phase splitter, a complex analytic representation of the far end echo:
   B) generating, by a conjugate Hilbert phase splitter, a conjugated complex analytic representation of the replica of the far end echo;
   C) providing, by a multiplier, an output by multiplying the complex analytic representation of the far end echo times the conjugated complex analytic representation of the replica of the far end echo; and
   D) generating, by a rectangular to polar converter, a normalized phase error.

10. The method of claim 9 wherein the step of generating by the conjugate Hilbert phase splitter includes:
    A) generating, by a second Hilbert phase splitter a complex analytic representation of the replica of the far end echo; and
    B) generating, by a conjugate generator the conjugated complex analytic representation of the replica of the far end echo.

11. The method of claim 9 wherein the step of generating by the rectangular to polar converter includes:
    A) determining, by a magnitude determiner, a magnitude of the output of the multiplier;
    B) generating, by a reciprocal generator, a reciprocal of the magnitude of the output of the multiplier;
    C) generating, by an imaginary operator, an imaginary component of the output of the multiplier; and
    D) multiplying, by a normalizer, the imaginary component and the reciprocal of the magnitude of the output of the multiplier to provide a normalized phase error.

12. The method of claim 8 wherein utilizing, by a phase locked loop, the phase error to generate an estimated phase of the far end echo includes:

A) generating, by a loop filter, a control signal; and
   B) generating, by a numerically controlled oscillator, the estimated phase of the far end echo.

13. The method of claim 8 wherein the phase locked loop is a second order phase locked loop.

14. The method of claim 8 wherein utilizing, by an efficient replica generator having a uniquely positioned phase rotator, the estimated phase of the far end echo to generate a replica of the far end echo includes:

A) providing, by a delay unit, a delayed transmit signal;
   B) rotating, by the phase rotator, the delayed transmit signal to match the phase of the far end echo; and
   C) providing, by the impulse response generator, a real component of a replica of the far end echo.

15. The method of claim 8 wherein the steps of the method are embodied in a tangible medium of/for a computer.

16. The method of claim 15 wherein the tangible medium is a computer diskette.

17. The method of claim 15 wherein the tangible medium is a memory unit of the computer.

18. A digital signal processor having a program in a program memory for efficiently determining and tracking a phase roll of a far end echo in a communication system embodied in the program memory, said program comprising the steps of:

A) utilizing steps simulating at least one Hilbert phase splitter to generate a phase error;
   B) utilizing steps simulating a phase lock loop to use the phase error to generate an estimated phase of the far end echo;
   C) utilizing steps simulating an efficient replica generator to use the estimated phase of the far end echo to generate a replica of the far end echo; and
   D) combining the far end echo and a real component of the replica of the far end echo to provide a residual far end echo.

19. The digital signal processor of claim 18 wherein utilizing steps simulating at least one Hilbert phase splitter to generate a phase error includes:

A) generating, by steps simulating a first Hilbert phase splitter, a complex analytic representation of the far end echo;
   B) generating, by steps simulating a conjugate Hilbert phase splitter, a conjugated complex analytic representation of the replica of the far end echo;
   C) multiplying the complex analytic representation of the far end echo and the conjugated complex analytic representation of the replica of the far end echo to provide a multiplied output; and
   D) generating, by steps simulating a rectangular to polar converter, a normalized phase error.

20. The digital signal processor of claim 19 wherein the steps simulating the conjugate Hilbert phase splitter include:

A) generating, by steps simulating a second Hilbert phase splitter, a complex analytic representation of the replica of the far end echo; and
   B) generating, by steps simulating a conjugate generator, the conjugated complex analytic representation of the replica of the far end echo.

21. The digital signal processor of claim 19 wherein the steps simulating the rectangular to polar converter include:

A) determining a magnitude of the multiplied output;
   B) generating a reciprocal of the magnitude of the multiplied output;
   C) generating an imaginary component of the multiplier output; and
   D) multiplying the imaginary component and the reciprocal of the magnitude of the multiplied output to provide a normalized phase error.

22. The digital signal processor of claim 18 wherein utilizing steps simulating a phase lock loop to use the phase error to generate an estimated phase of the far end echo includes:

A) generating, by steps simulating a loop filter, a control signal; and
   B) generating, by steps simulating a numerically controlled oscillator, the estimated phase of the far end echo.

23. The digital signal processor of claim 18 wherein the phase locked loop is a second order phase locked loop.

24. The digital signal processor of claim 18 wherein utilizing steps simulating an efficient replica generator to use the estimated phase of the far end echo to generate a replica of the far end echo includes:

A) providing a delayed transmit signal;
   B) rotating the delayed transmit signal to match the phase of the far end echo; and
   C) utilizing steps simulating an impulse response generator to provide a real component of a replica of the far end echo.

25. A modem having a digital signal processor that includes a computer program embodied in a tangible medium for efficiently determining and tracking a phase roll of a far end echo in a communication system embodied in a program memory, said program comprising the steps of:

A) utilizing steps simulating at least one Hilbert phase splitter to generate a phase error;
   B) utilizing steps simulating a phase lock loop to use the phase error to generate an estimated phase of the far end echo;
   C) utilizing steps simulating an efficient replica generator to use the estimated phase of the far end echo to generate a replica of the far end echo; and
   D) combining the far end echo and the real component of the replica of the far end echo to provide a residual far end echo.

26. The modem of claim 25 wherein the tangible medium is a memory unit.

27. The modem of claim 25 wherein utilizing steps simulating at least one Hilbert phase splitter to generate a phase error includes:

A) generating, by steps simulating a first Hilbert phase splitter, a complex analytic representation of the far end echo;
   B) generating, by steps simulating a conjugate Hilbert phase splitter, a conjugated complex analytic representation of the replica of the far end echo;
   C) multiplying the complex analytic representation of the far end echo and the conjugated complex analytic representation of the replica of the far end echo to provide a multiplied output; and
   D) generating, by steps simulating a rectangular to polar converter, a normalized phase error.

28. The modem of claim 25 wherein the steps simulating the conjugate Hilbert phase splitter include:

A) generating, by steps simulating a second Hilbert phase splitter, a complex analytic representation of the replica of the far end echo; and B) generating, by steps simulating a conjugate generator, the conjugated complex analytic representation of the replica of the far end echo.

29. The modem of claim 25 wherein the steps simulating the rectangular to polar converter include:

A) determining a magnitude of the multiplied output;

B) generating a reciprocal of the magnitude of the multiplied output;

C) generating an imaginary component of the multiplier output; and

D) multiplying the imaginary component and the reciprocal of the magnitude of the multiplied output to provide a normalized phase error.

30. The modem of claim 25 wherein utilizing steps simulating a phase lock loop to use the phase error to generate an estimated phase of the far end echo includes:

A) generating, by steps simulating a loop filter, a control signal; and

B) generating, by steps simulating a numerically controlled oscillator, the estimated phase of the far end echo.

31. The modem of claim 25 wherein the phase locked loop is a second order phase locked loop.

32. The modem of claim 25 wherein utilizing steps simulating an efficient replica generator to use the estimated phase of the far end echo to generate a replica of the far end echo includes:

A) providing a delayed transmit signal;

B) rotating the delayed transmit signal to match the phase of the far end echo; and C) utilizing steps simulating an impulse response generator to provide a real component of a replica of the far end echo.

33. A method for efficiently determining and tracking phase roll of a far end echo in a communication system comprising the steps of: upon receiving a far end echo signal, A) rotating delayed transmit symbols by a phase roll estimate to obtain a rotated output and applying the rotated output to an echo replica filter to provide a filtered output;

B) utilizing the filtered output to generate an echo replica having a next L echo replica samples, L a predetermined integer;

C) subtracting the echo replica from a received far end echo signal having a next L received echo samples to provide a residual far end echo signal;

D) converting the echo replica to a complex analytic replica;

E) converting the received far end echo signal to a complex analytic echo signal;

F) conjugate multiplying the complex analytic replica by the complex analytic echo signal to form a complex error signal;

G) dividing an imaginary portion of the complex error signal by a magnitude of the complex error signal to form a phase error; and H) applying the phase error to a loop filter and a numerically controlled oscillator to form a new phase roll estimate.

* * * * *